United States Patent
Morita et al.

(10) Patent No.: US 8,748,301 B2
(45) Date of Patent: *Jun. 10, 2014

(54) DIFFUSING AGENT COMPOSITION FOR INK-JET, AND METHOD FOR PRODUCTION OF ELECTRODE OR SOLAR BATTERY USING THE COMPOSITION

(75) Inventors: Toshiro Morita, Kawasaki (JP); Katsuya Tanitsu, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 727 days.

This patent is subject to a terminal disclaimer.

(21) Appl. No.: 12/934,248

(22) PCT Filed: Apr. 8, 2009

(86) PCT No.: PCT/JP2009/057179
§ 371 (c)(1),
(2), (4) Date: Sep. 23, 2010

(87) PCT Pub. No.: WO2009/125787
PCT Pub. Date: Oct. 15, 2009

(65) Prior Publication Data
US 2011/0017291 A1    Jan. 27, 2011

(30) Foreign Application Priority Data

Apr. 9, 2008   (JP) ................... 2008-101053

(51) Int. Cl.
| | | |
|---|---|---|
| *H01L 21/225* | (2006.01) | |
| *C09D 201/10* | (2006.01) | |
| *H01L 51/00* | (2006.01) | |
| *H01L 31/18* | (2006.01) | |

(52) U.S. Cl.
CPC ........... *H01L 51/0005* (2013.01); *Y02E 10/549* (2013.01); *Y02E 10/547* (2013.01); *H01L 31/1804* (2013.01); *H01L 51/0007* (2013.01); *H01L 51/0022* (2013.01)

USPC ... 438/542; 438/562; 257/E21.15; 106/287.1; 106/287.14; 106/287.16; 106/287.34

(58) Field of Classification Search
USPC ............... 106/287.16, 287.1, 287.34, 287.14; 438/562, 542; 257/E21.15
See application file for complete search history.

(56) References Cited

U.S. PATENT DOCUMENTS

| | | | | |
|---|---|---|---|---|
| 4,152,886 | A | * | 5/1979 | Nelson ............................. 57/208 |
| 6,090,448 | A | * | 7/2000 | Wallace et al. ................ 427/337 |
| 6,695,903 | B1 | * | 2/2004 | Kubelbeck et al. ...... 106/287.14 |
| 2009/0239363 | A1 | * | 9/2009 | Leung et al. .................. 438/562 |
| 2009/0292053 | A1 | * | 11/2009 | Morita ........................... 524/438 |
| 2013/0061922 | A1 | * | 3/2013 | Murota et al. ................. 136/256 |

FOREIGN PATENT DOCUMENTS

| | | |
|---|---|---|
| JP | 2003-109754 A | 4/2003 |
| JP | 2005-038997 A | 2/2005 |
| JP | 2008-021951 A | 1/2008 |
| WO | WO 2008/007576 A1 | 1/2008 |

OTHER PUBLICATIONS

International Search Report issued in corresponding PCT Application No. PCT/JP2009/057179, mailed Jul. 21, 2009.

* cited by examiner

*Primary Examiner* — David M Brunsman
(74) *Attorney, Agent, or Firm* — Knobbe Martens Olson & Bear LLP

(57) ABSTRACT

Provided are: a diffusing agent composition for ink-jet; a method for production of electrode and solar battery using the diffusing agent composition; and a solar battery produced by the method for production. The diffusing agent composition for ink-jet includes (a) a silicon compound, (b) an impurity-diffusing component and (c) a solvent, in which: the solvent (c) contains (c1) a solvent having a boiling point of no higher than 100° C. and (c2) a solvent having a boiling point of 180 to 230° C.; and the solvent (c1) is contained at a ratio of 70 to 90% by mass and the solvent (c2) is contained at a ratio of 1 to 20% by mass both relative to the total mass of the composition.

8 Claims, 6 Drawing Sheets

DIFFUSING AGENT COMPOSITION FOR INK-JET, AND METHOD FOR PRODUCTION OF ELECTRODE OR SOLAR BATTERY USING THE COMPOSITION

RELATED APPLICATIONS

This application is the U.S. National Phase filing under 35 U.S.C. §371 of PCT/JP2009/057179, filed Apr. 8, 2009, which designated the United States and was published in a language other than English as PCT WO2009/125787 on Oct. 15, 2009, which claims priority under 35 U.S.C. §119(a)-(d) to Japanese Patent Application No. 2008-101053, filed Apr. 9, 2008. The contents of these applications are incorporated herein by reference in their entireties.

TECHNICAL FIELD

The present invention relates to a diffusing agent composition for ink-jet, a method for production of an electrode and a solar battery using the composition, and a solar battery produced using the method for production.

BACKGROUND ART

In recent years, when semiconductors, particularly solar batteries are produced, a method in which a layer containing an impurity-diffusing component referred to as dopant (diffusing agent composition layer) is formed using an ink-jet system has been employed. This method has been expected to contribute to reduction of the production cost since easy pattern formation is enabled without need of a complicated step as compared with conventionally employed lithographic methods and the like. In particular, by using ink-jet printing, a diffusing agent composition can be coated only onto a desired site, and thus significant reduction of the amount of the diffusing agent composition used is enabled as compared with conventionally employed methods of coating a diffusing agent composition such as a spin coating method.

Accordingly, by using an ink-jet system, an operation to form a pattern is facilitated, and the amount of the diffusing agent composition used can be reduced. However, conventional diffusing agent compositions containing ethanol or isopropyl alcohol as a principal component are disadvantageous in discharge stability due to too rapid drying characteristics which result in clogging at a head portion, and the like. In this regard, a method for further improving discharge stability of a diffusing agent composition was proposed in which prevention of clogging, etc., is enabled by adding 20 to 40% by volume of glycerin and dimethyl formamide (DMF) to a conventional diffusing agent compositions containing ethanol or isopropyl alcohol as a principal component (Patent Document 1).

Patent Document 1: Japanese Unexamined Patent Application, Publication No. 2005-038997

DISCLOSURE OF THE INVENTION

Problems to be Solved by the Invention

However, when the surface of the substrate on which the diffusing agent composition is coated has a material entity resistant to infiltration of the diffusing agent composition, and a solvent having a high boiling point such as glycerin or dimethyl formamide is contained in the diffusing agent composition in a large amount as disclosed in Patent Document 1, the coating liquid is hard to dry, so that the pattern after coating may bleed or spread, whereby another disadvantage of blurring of the coated pattern in a time dependent manner has been found.

In view of such circumstances, an object of the present invention is to provide a diffusing agent composition for ink-jet (hereinafter, referred to as "diffusing agent composition") which is capable of forming a diffusing agent composition layer by selectively coating the diffusing agent composition using an ink-jet system, a method for production of an electrode and a solar battery using the composition, and a solar battery produced by the method for production.

Means for Solving the Problems

The present inventors found that the foregoing problems can be solved by adjusting the type and the content of a solvent contained in a diffusing agent composition, and thus the present invention was completed.

According to a first aspect of the present invention, a diffusing agent composition is provided including (a) a silicon compound, (b) an impurity-diffusing component and (c) a solvent, in which: the solvent (c) contains (c1) a solvent having a boiling point of no higher than 100° C. and (c2) a solvent having a boiling point of 180 to 230° C.; and the solvent (c1) is contained at a ratio of 70 to 90% by mass and the solvent (c2) is contained at a ratio of 1 to 20% by mass both relative to the total mass of the composition.

According to a second aspect of the present invention, a method for production of an electrode is provided including the steps of: forming a pattern by discharging the composition on a semiconductor substrate by an ink-jet system; and allowing the impurity-diffusing component (b) in the pattern to be diffused into the semiconductor substrate.

According to a third aspect of the present invention, a method for production of a solar battery is provided including the above method for production of an electrode.

According to a fourth aspect of the present invention, a solar battery is provided produced by the method for production of a solar battery.

EFFECTS OF THE INVENTION

According to the present invention, a pattern formation is permitted without occurrence of bleeding and the like even if a diffusing agent composition is coated on the surface of a material entity which is resistant to infiltration of the diffusing agent composition. Accordingly, pattern formation on the substrate is enabled so as to conform to initially intended pattern with fidelity. Moreover, according to the present invention, production of a nonuniform coating of the diffusing agent composition layer formed after coating can be prevented by containing the solvent (c2) having a boiling point of 180 to 230° C.

PREFERRED MODE FOR CARRYING OUT THE INVENTION

Figure 1:
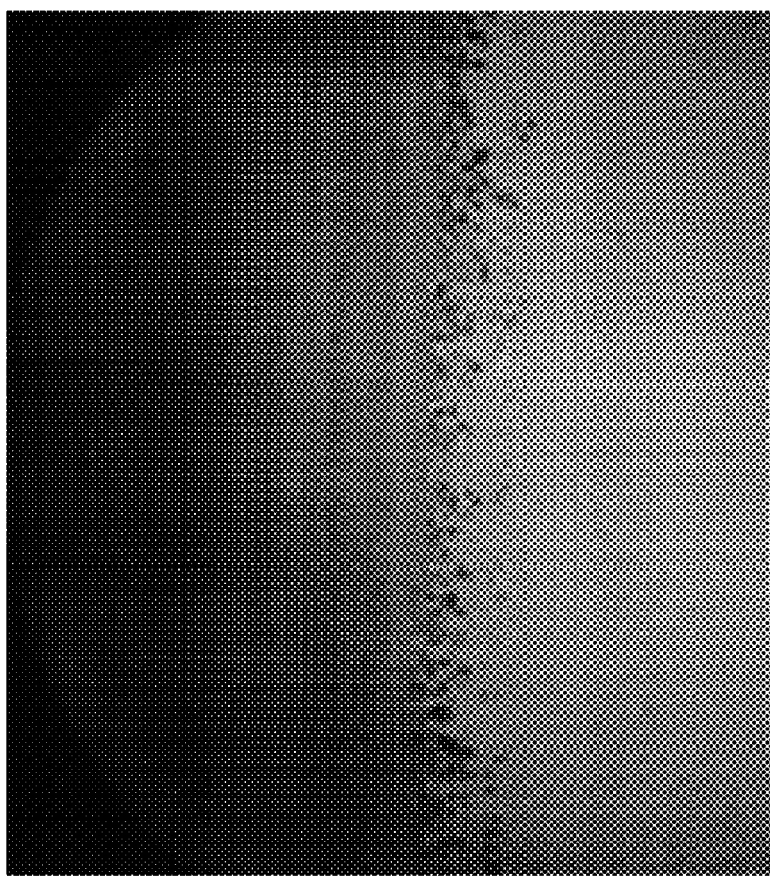
FIG. 1 shows a view illustrating a part of a layer formed using a diffusing agent composition of Example 2.

Embodiments of the present invention are described below, but not limited thereto.

According to the first aspect of the present invention, a diffusing agent composition is provided including (a) a silicon compound, (b) an impurity-diffusing component and (c) a solvent, in which: the solvent (c) contains (c1) a solvent having a boiling point of no higher than 100° C. and (c2) a solvent having a boiling point of 180 to 230° C.; and the solvent (c1) is contained at a ratio of 70 to 90% by mass and the solvent (c2) is contained at a ratio of 1 to 20% by mass both relative to the total mass of the composition. Herein, the silicon compound (a), the impurity-diffusing component (b) and the solvent (c) are as described below.

(a) Silicon Compound

The silicon compound (hereinafter, may be also referred to as "component (a)") is not particularly limited, and may be a conventionally well-known compound for forming a silicon based coating on a semiconductor substrate such as, for example, those for use in forming an interlayer insulating film. By using the component (a), heat resistance can be imparted to the diffusing agent composition. As such a component (a), an inorganic or organic silicon-containing compound may be exemplified.

Inorganic Silicon-Containing Compound

As the inorganic silicon-containing compound, inorganic silicon-containing compounds which have been used as conventionally well-known inorganic filler in production of semiconductors may be exemplified. For example, compounds having (—O—Si—O—)$_n$ as a skeleton are preferred, in general.

Organic Silicon-Containing Compound

As the organic silicon-containing compound, a compound for formation of a silica based film according to a conventionally well-known SOG (Spin On Glass) method may be used, and a siloxane polymer is preferred. As such a siloxane polymer, for example, a reaction product obtained by subjecting at least one selected from the group consisting of alkoxysilane represented by the following general formula (I) to a hydrolysis reaction may be used.

$$R_{4-n}Si(OR')_n \qquad (I)$$

In the formula, R represents a hydrogen atom, an alkyl group or a phenyl group; R' represents an alkyl group or a phenyl group; and n represents an integer of 2 to 4, provided that R is bound in plural number to Si, the R in plural number may be the same or different; and a plural number of (OR') groups bound to Si may be the same or different.

The alkyl group as represented by R is preferably a linear or branched alkyl group having 1 to 20 carbon atoms, and more preferably a linear or branched alkyl group having 1 to 4 carbon atoms. At least one among R which may be present in plural number is an alkyl group or a phenyl group.

The alkyl group as represented by R' is preferably a linear or branched alkyl group having 1 to 5 carbon atoms. The alkyl group as represented by R' particularly preferably has 1 or 2 carbon atoms in light of the rate of hydrolysis.

The reaction product obtained by subjecting the silane compound to a hydrolysis reaction may include a hydrolysate having a low molecular weight, and condensates (siloxane oligomers) generated by causing an intermolecular dehydrative condensation reaction concomitant with the hydrolysis reaction. The siloxane polymer as used herein means, when such a hydrolysate or condensate is included, the entirety also including these compounds.

The siloxane polymer has a mass average molecular weight (Mw) (in terms of the polystyrene equivalent according to gel permeation chromatography, the same in the following,) of preferably 1,000 to 3,000. The mass average molecular weight is more preferably in the range of 1,200 to 2,700, and still more preferably in the range of 1,500 to 2,000.

A silane compound (i) is represented by the following general formula (II) when n in the above general formula is (I) is 4.

$$Si(OR^1)_a(OR^2)_b(OR^3)_c(OR^4)_d \qquad (II)$$

In the formula, $R^1$, $R^2$, $R^3$ and $R^4$ each independently represent an alkyl group or a phenyl group as defined for the above R'; a, b, c and d are integers that satisfy the numerical correlation of $0 \leq a \leq 4$, $0 \leq b \leq 4$, $0 \leq c \leq 4$ and $0 \leq d \leq 4$, and also meet the numerical expression of $a+b+c+d=4$.

A silane compound (II) is represented by the following general formula (III) when n in the general formula (I) is 3.

$$R^5Si(OR^6)_e(OR^7)_f(OR^8)_g \qquad (III)$$

In the formula, $R^5$ represents a hydrogen atom, an alkyl group, or a phenyl group as defined for the above R. $R^6$, $R^7$, and $R^8$ each independently represent an alkyl group or a phenyl group as defined for the above R'; e, f, and g are integers that satisfy the numerical correlation of $0 \leq e \leq 3$, $0 \leq f \leq 3$, $0 \leq g \leq 3$, and also meet the numerical expression of $e+f+g=3$.

A silane compound (iii) is represented by the following general formula (IV) when n in the general formula (I) is 2.

$$R^9R^{10}Si(OR^{11})_h(OR^{12})_i \qquad (IV)$$

In the formula, $R^9$ and $R^{10}$ represent a hydrogen atom, an alkyl group, or a phenyl group as defined for the above R; however, at least one of $R^9$ and $R^{10}$ represent an alkyl group or a phenyl group; $R^{11}$, and $R^{12}$ each independently represent an alkyl group or a phenyl group as defined for the above R'; h and i are integers that satisfy the numerical correlation of $0 \leq h \leq 2$, $0 \leq i \leq 2$, and also meet the numerical expression $h+i=2$.

Specific examples of the silane compound (i) include tetraalkoxysilane such as tetramethoxysilane, tetraethoxysilane, tetrapropoxysilane, tetrabutoxysilane, tetrapentyloxysilane, tetraphenyloxysilane, trimethoxymonoethoxysilane, dimethoxydiethoxysilane, triethoxymonomethoxysilane, trimethoxymonopropoxysilane, monomethoxytributoxysilane, monomethoxytripentyloxysilane, monomethoxytriphenyloxysilane, dimethoxydipropoxysilane, tripropoxymonomethoxysilane, trimethoxymonobutoxysilane, dimethoxydibutoxysilane, triethoxymonopropoxysilane, diethoxydipropoxysilane, tributoxymonopropoxysilane, dimethoxymonoethoxymonobutoxysilane, diethoxymonomethoxymonobutoxysilane, diethoxymonopropoxymonobutoxysilane, dipropoxymonomethoxymonoethoxysilane, dipropoxymonomethoxymonobutoxysilane, dipropoxymonoethoxymonobutoxysilane, dibutoxymonomethoxymonoethoxysilane, dibutoxymonoethoxymonopropoxysilane and monomethoxymonoethoxymonopropoxymonobutoxysilane, and among these, tetramethoxysilane and tetraethoxysilane are preferred.

Specific examples of the silane compound (II) include methyltrimethoxysilane, methyltriethoxysilane, methyltripropoxysilane, methyltripentyloxysilane, ethyltrimethoxysilane, ethyltripropoxysilane, ethyltripentyloxysilane, ethyltriphenyloxysilane, propyltrimethoxysilane, propyltriethoxysilane, propyltripentyloxysilane, propyltriphenyloxysilane, butyltrimethoxysilane, butyltriethoxysilane, butyltripropoxysilane, butyltripentyloxysilane, butyltriphenyloxysilane, methylmonomethoxydiethoxysilane, ethylmonomethoxydiethoxysilane, propylmonomethoxydiethoxysilane, butylmonomethoxydiethoxysilane, methylmonomethoxydipropoxysilane, methylmonomethoxydipentyloxysilane, methylmonomethoxydiphenyloxysilane, ethylmonomethoxydipropoxysilane, ethylmonomethoxydipentyloxysilane, ethylmonomethoxydiphenyloxysilane, propylmonomethoxydipropoxysilane, propylmonomethoxydipentyloxysilane, propylmonomethoxydiphenyloxysilane, butylmonomethoxydipropoxysilane, butylmonomethoxydipentyloxysilane, butylmonomethoxydiphenyloxysilane, methylmethoxyethoxypropoxysilane, propylmethoxyethoxypropoxysilane, butylmethoxyethoxypropoxysilane, methylmonomethoxymonoethoxymonobutoxysilane, ethylmonomethoxymonoethoxymonobutoxysilane, propylmonomethoxymonoethoxymonobutoxysilane, butylmonomethoxymonoethoxymonobutoxysilane and the like, and among these, methyltrialkoxysilane (particularly methyltrimethoxysilane and methyltriethoxysilane) is preferred.

Specific examples of the silane compound (iii) include methyldimethoxysilane, methylmethoxyethoxysilane, methyldiethoxysilane, methylmethoxypropoxysilane, methylmethoxypentyloxysilane, methylmethoxyphenyloxysilane, ethyldipropoxysilane, ethylmethoxypropoxysilane, ethyldipentyloxysilane, ethyldiphenyloxysilane, propyldimethoxysilane, propylmethoxyethoxysilane, propylethoxypropoxysilane, propyldiethoxysilane, propyldipentyloxysilane, propyldiphenyloxysilane, butyldimethoxysilane, butylmethoxyethoxysilane, butyldiethoxysilane, butylethoxypropoxysilane, butyldipropoxysilane, butylmethyldipentyloxysilane, butylmethyldiphenyloxysilane, dimethyldimethoxysilane, dimethylmethoxyethoxysilane, dimethyldiethoxysilane, dimethyldipentyloxysilane, dimethyldiphenyloxysilane, dimethylethoxypropoxysilane, dimethyldipropoxysilane, diethyldimethoxysilane, diethylmethoxypropoxysilane, diethyldiethoxysilane, diethylethoxypropoxysilane, dipropyldimethoxysilane, dipropyldiethoxysilane, dipropyldipentyloxysilane, dipropyldiphenyloxysilane, dibutyldimethoxysilane, dibutyldiethoxysilane, dibutyldipropoxysilane, dibutylmethoxypentyloxysilane, dibutylmethoxyphenyloxysilane, methylethyldimethoxysilane, methylethyldiethoxysilane, methylethyldipropoxysilane, methylethyldipentyloxysilane, methylethyldiphenyloxysilane, methylpropyldimethoxysilane, methylpropyldiethoxysilane, methylbutyldimethoxysilane, methylbutyldiethoxysilane, methylbutyldipropoxysilane, methylethylethoxypropoxysilane, ethylpropyldimethoxysilane, ethylpropylmethoxyethoxysilane, dipropyldimethoxysilane, dipropylmethoxyethoxysilane, propylbutyldimethoxysilane, propylbutyldiethoxysilane, dibutylmethoxyethoxysilane, dibutylmethoxypropoxysilane, dibutylethoxypropoxysilane and the like, and among these, methyldimethoxysilane and methyldiethoxysilane are preferred.

The silane compound used for obtaining the reaction product described above may be selected appropriately from among the silane compounds (i) to (iii). As the silane compound, the silane compound (i) is most preferred. When these silane compounds are used as a mixture, more preferable combination is a combination of the silane compound (i) and the silane compound (ii). With respect to the ratio of the silane compound (i) and the silane compound (ii) when used in combination, the range of 10 to 60% by mole of the silane compound (i) and 90 to 40% by mole of the silane compound (ii) is preferred, and the range of 15 to 50% by mole of the silane compound (i) and 85 to 50% by mole of the silane compound (ii) is more preferred. In addition, with respect to the silane compound (ii), $R^5$ in the above general formula (III) represents preferably an alkyl group or a phenyl group, and more preferably an alkyl group.

The aforementioned reaction product may be prepared by, for example, a method in which at least one selected from the aforementioned silane compounds (i) to (iii) is subjected to a hydrolytic condensation reaction in the presence of an acid catalyst, water, and an organic solvent.

The acid catalyst which may be used is any one of an organic acid and an inorganic acid. The inorganic acid which may be used is sulfuric acid, phosphoric acid, nitric acid or hydrochloric acid, and of these, phosphoric acid and nitric acid are suitable. Examples of the organic acid which may be used include carboxylic acids such as formic acid, oxalic acid, fumaric acid, maleic acid, glacial acetic acid, acetic anhydride, propionic acid and n-butyric acid, and organic acids having a sulfur-containing acid residue. As the organic acid having a sulfur-containing acid residue, organic sulfonic acids are exemplified, and esterified products of the same include organic sulfuric acid esters, organic sulfurous acid esters, and the like. Among these, an organic sulfonic acid, for example, a compound represented by the following general formula (V) is particularly preferred.

$$R^{13}-X \qquad (V)$$

In the formula, $R^{13}$ represents a hydrocarbon group which may have a substituent; and X represents a sulfonic acid group.

In the above general formula (V), the hydrocarbon group as represented by $R^{13}$ is preferably a hydrocarbon group having 1 to 20 carbon atoms, and this hydrocarbon group may be either saturated or unsaturated, and may be any of linear, branched and cyclic. When $R^{13}$ represents a hydrocarbon group which is cyclic, preferred are, for example, aromatic hydrocarbon groups such as a phenyl group, a naphthyl group and an anthryl group, and a phenyl group is preferred in particular. To the aromatic ring in this aromatic hydrocarbon group may bind one or multiple hydrocarbon groups having 1 to 20 carbon atoms as a substituent. The hydrocarbon group as the substitute on the aromatic ring may be either saturated or unsaturated, and may be any of linear, branched, and cyclic. In addition, the hydrocarbon group as represented by $R^{13}$ may have one or multiple substituents, and the substituent may include, for example, a halogen atom such as a fluorine atom, a sulfonic acid group, a carboxyl group, a hydroxyl group, an amino group, a cyano group, or the like. The organic sulfonic acid represented by the above general formula (V) is particularly preferably nonafluorobutanesulfonic acid, methanesulfonic acid, trifluoromethanesulfonic acid or dodecylbenzenesulfonic acid, a mixture thereof, or the like in light of the effect of improving the shape of the lower portion of the resist pattern.

The acid catalyst serves as a catalyst in hydrolyzing the silane compound in the presence of water, and the amount of the acid catalyst used may be adjusted such that the concentration in the reaction system of the hydrolysis reaction falls within the range of 1 to 1,000 ppm, particularly 5 to 800 ppm. The amount of water added is determined to meet the intended hydrolysis rate since the hydrolysis rate of the siloxane polymer varies depending on the amount of water. The hydrolysis rate of the siloxane polymer referred to herein means a rate (unit: %) of the number (mol number) of water molecules relative to the number (mol number) of alkoxy groups in the silane compound that is present in the reaction system of the hydrolysis reaction for synthesizing the siloxane polymer. In the present invention, the hydrolysis rate of the siloxane polymer is preferably 50 to 200%, and more preferable in the range of 75 to 180%.

Examples of the organic solvent in the reaction system of the hydrolysis reaction include monovalent alcohols such as methanol, ethanol, propanol, isopropanol (IPA) and n-butanol; alkylcarboxylate esters such as methyl-3-methoxypropionate and ethyl-3-ethoxypropionate; polyhydric alcohols such as ethylene glycol, diethylene glycol, propylene glycol, glycerin, trimethylolpropane and hexanetriol; monoethers of a polyhydric alcohol such as ethylene glycol monomethyl ether, ethylene glycol monoethyl ether, ethylene glycol monopropyl ether, ethylene glycol monobutyl ether, diethylene glycol monomethyl ether, diethylene glycol monoethyl ether, diethylene glycol monopropyl ether, diethylene glycol monobutyl ether, propylene glycol monomethyl ether, propylene glycol monoethyl ether, propylene glycol monopropyl ether and propylene glycol monobutyl ether, or monoacetates of the same; esters such as methyl acetate, ethyl acetate and buthyl acetate; ketones such as acetone, methyl ethyl ketone and methyl isoamyl ketone; polyhydric alcohol ethers prepared by alkyl etherification of all hydroxyl groups of a polyhydric alcohol, such as ethylene glycol dimethyl ether, ethylene glycol diethyl ether, ethylene glycol dipropyl ether, ethylene glycol dibutyl ether, propylene glycol dimethyl ether, propylene glycol diethyl ether, diethylene glycol dimethyl ether, diethylene glycol diethyl ether and diethylene glycol methylethyl ether, and the like. The aforementioned organic solvent may be used alone, or two or more may be used in combination.

A siloxane polymer is obtained by allowing a hydrolysis reaction to proceed in such a reaction system. Although the hydrolysis reaction is completed within about 5 to 100 hrs in general, the reaction system may be heated in the temperature range not to exceed 80° C. for shortening the reaction time period.

After completing the reaction, a reaction solution containing the synthesized siloxane polymer, and the organic solvent used in the reaction is obtained. The siloxane polymer can be obtained by separating from the organic solvent according to a conventionally well-known method, followed by drying.

The amount of the silicon compound blended in the diffusing agent composition according to the present invention is preferably 2 to 10% by mass relative to the total amount of the composition in terms of the $SiO_2$ equivalent.

By blending the silicon compound in an amount falling within the above range, a film not accompanied by a crack can be formed, and favorable effect of diffusing the impurity can be achieved. Particularly, the amount of the silicon compound of 2 to 5% by mass is preferred.

(b) Impurity-Diffusing Component

As the impurity-diffusing component (hereinafter, may be also referred to as "component (b)"), a compound which has been generally used as a dopant for production of solar batteries may be used. Such a component (b) can form a "p" type or "n" type diffusion region within a silicon substrate in the step of forming an electrode when it contains an oxide of a group III element or a compound of a group V element. For example, the compound may be selected from among compounds of the group III element when formation of a "p" type diffusion region is intended, or may be selected from among compounds of the group V element when formation of an "n" type diffusion region is intended. Alternatively, a compound of the group III element and a compound of the group V element may be used in arbitrary combination, depending on property of the desired diffusion region. Such compounds of the group III element and the group V element include, for example, $B_2O_3$, $Al_2O_3$, $Bi_2O_3$, $P_2O_5$ and the like, and one or more among these may be include in the component (b) as needed depending on whether the diffusion region should be of "p" type or "n" type. The compound of the group III element or the compound of the group V element is contained in the diffusing agent composition in an amount of preferably no less than 0.1% by mass, and more preferably no less than 1.0% by mass. It is to be noted that the balance of the amount of the silicon compound (a) and the amount of the impurity-diffusing component (b) as blended is important for achieving the effect of diffusing the impurity. Particularly, when the amount of the silicon compound (a) blended ranges from 2 to 5% by mass, and the amount of the impurity-diffusing component (b) blended ranges from 1.5 to 3.0% by mass, favorable diffusing effect can be achieved.

(c) Solvent

The solvent (hereinafter, may be also referred to as "component (c)") includes (c1) a solvent having a boiling point of no higher than 100° C., and (c2) a solvent having a boiling point of 180 to 230° C.

(c1) Solvent Having Boiling Point of No Higher than 100° C.

The solvent having a boiling point of no higher than 100° C. (hereinafter, may be also referred to as "component (c1)") may be any organic solvent as long as the boiling point at normal atmospheric pressure falls within the above range. The drying rate of the diffusing agent composition is accelerated by containing the component (c1), whereby bleeding and spreading of the pattern after coating can be prevented. Examples of such a component (c1) include methanol, ethanol, ethyl acetate, methyl acetate, methyl ethyl ketone, and acetone. Of these, ethanol is preferred. Further, the component (c1) is preferably contained in the range of 70 to 90% by mass, and 72 to 80% by mass in particular, of the diffusing agent composition. Moreover, the component (c1) may be used alone, or two or more of the component (c1) may be used as a mixture.

(c2) Solvent Having Boiling Point of 180 to 230° C.

The solvent having a boiling point of 180 to 230° C. (hereinafter, may be also referred to as "component (c2)") may be any organic solvent as long as the boiling point falls within the above range. Production of nonuniform coating of the diffusing agent composition layer formed after coating can be prevented by coating the component (c2). Examples of such a component (c2) include polyhydric alcohols such as propylene glycol, and ethylene glycol. Of these, propylene glycol is preferred. Further, the component (c2) is preferably contained in the range of 1 to 20% by mass, and 2 to 10% by mass in particular, of the diffusing agent composition. The difference between maximum and minimum film thicknesses of the diffusing agent composition layer formed after coating can be minimized to no greater than 0.1 μm by containing the component (c2) in the aforementioned range. When the content of the solute components (substantially, total amount of the silicon compound (a) and the impurity-diffusing component (b) as principal components) is extremely low of no greater than 5% by mass, the total mass of the component (c2) and dipropylene glycol described later of no greater than 10% by mass, and preferably no greater than 8% by mass of the total mass of the composition is desired since a favorable film having a pattern without bleeding can be formed. It should be noted that the component (c2) may be used alone, or two or more of the component (c2) may be used as a mixture.

The component (c) may further contain dipropylene glycol or the like that is a commonly used solvent for preventing clogging of an ink-jet discharging device and the like at the head portion. Particularly, dipropylene glycol is preferred. It is preferred that the amount of dipropylene glycol blended ranges 1 to 10% by mass, and particularly 2 to 7% by mass in the diffusing agent composition.

Other Components (d) Surfactant

The diffusing agent composition according to the present invention may further contain a surfactant (hereinafter, may be also referred to as "component (d)"). The coating property, flattening property and spreading property can be improved by containing the component (d), and thus production of nonuniform coating of the diffusing agent composition layer formed after coating can be reduced. As such a component (d), conventionally well-known surfactant may be used, and a silicone based surfactant is preferred. Moreover, it is preferred that the component (d) is contained in the range of 500 to 3,000 ppm by mass, and particularly 600 to 2,500 ppm by mass relative to the total mass of the diffusing agent composition. Furthermore, the mass of the component (d) of no greater than 2,000 ppm by mass is preferred since superior detachment property of the diffusing agent composition layer after subjecting to the diffusion treatment is achieved. The component (d) may be used either alone, or in combination.

Porogen or Colloidal Silica

The diffusing agent composition according to the present invention may be used for producing an electrode for use in solar batteries as described later. Generally, semiconductor substrates frequently used in solar batteries are silicon substrates, and the surface of the silicon substrate has fine irregularity having a roughness of about 2 μm referred to as texture. When a diffusing agent composition is coated on the texture, the coated diffusing agent composition may have too thick layer at places where the vertical interval is great due to the irregularity. Thus, when the coated diffusing agent composition contracts by heating, a crack may be generated, and the layer of the diffusing agent composition formed after coating may rise from the substrate, whereby the diffusion efficiency of the impurity diffusing agent component may be deteriorated. In the present invention, an additive that decreases the stress in the layer formed with the coated diffusing agent composition may be further contained. The additive may be exemplified by a porogen or a colloidal silica. By thus containing a porogen or colloidal silica, generation of crack and rising of the diffusing agent composition layer from the substrate can be prevented which may occur when the formed diffusing agent composition layer is heated.

Porogen

The porogen as referred to herein is a material which is decomposed during baking the diffusing agent composition layer to form pores in the film of the silicon compound finally produced. Examples of the porogen include polyalkylene glycol and terminal alkylated products thereof; monosaccharides such as glucose, fructose and galactose, and derivatives thereof; disaccharides such as sucrose, maltose and lactose, and derivatives thereof; and polysaccharides and derivatives thereof. Among these organic compounds, polyalkylene glycol is preferred, and polypropylene glycol is more preferred. The aforementioned porogen has a mass average molecular weight of preferably 300 to 10,000, and more preferably 500 to 5,000. When the porogen has a mass average molecular weight of no less than 300, decomposition and volatilization in coating and drying the diffusing agent composition can be suppressed, whereby satisfactory effects of the porogen can be achieved during the heat diffusion treatment. On the other hand, when the mass average molecular weight is no greater than 10,000, decomposition is more likely to occur during the heat diffusion treatment, whereby satisfactory effects of the porogen can be achieved.

Colloidal Silica

In the present invention, a colloidal silica can be used in place of the porogen. It is preferred that the colloidal silica be dispersed in an organic solvent. The organic solvent is not particularly limited as long as it does not have an effect on the aforementioned component (c), and for example, lower aliphatic alcohols such as methanol, ethanol, isopropanol (IPA), n-butanol and isobutanol, ethylene glycol derivatives such as ethylene glycol, ethylene glycol monobutyl ether and acetic acid ethylene glycol monoethyl ether, diethylene glycol derivatives such as diethylene glycol and diethylene glycol monobutyl ether, diacetone alcohol, and the like may be exemplified. One, or at least two selected from the group consisting of these compounds may be used. Furthermore, one, or at least two of toluene, xylene, hexane, heptaneethyl acetate, buthyl acetate, methyl ethyl ketone, methyl isobutyl ketone, methyl ethyl keto oxime and the like may be used in combination with these organic solvents. The particle size of the silica particles is not particularly limited as long as clogging of an ink-jet discharging device or the like at the head portion is not caused, and is preferably 10 to 50 nm.

The content of the porogen or colloidal silica is preferably no greater than 10% by mass of the entire solid content, or no greater than 1% by mass of the entire diffusing agent composition. By thus adjusting the content, deterioration of the diffusion efficiency of the component (b) can be prevented when the porogen is used, whereas clogging of the ink-jet discharging device and the like at the head portion resulting from aggregation of the silica particles, and time dependent deterioration of the component (a) can be prevented when the colloidal silica is used.

Method for Preparing Diffusing Agent Composition

The diffusing agent composition according to the present invention can be prepared by mixing each component described above by a conventionally well-known method in an arbitrary order so as to give a homogenous mixture. In this step, the mixture is preferably prepared to give the concentration of the total solid content of no greater than 6% by mass. By adjusting the concentration to fall within such a range, the pattern formed following discharging can be regulated to have an appropriate thickness.

Method for Production of Electrode

According to the second aspect of the present invention, a method for production of an electrode is provided including the steps of: forming a pattern by discharging the diffusing agent composition on a semiconductor substrate by an ink-jet system; and allowing the impurity-diffusing component (b) in the pattern to be diffused into the semiconductor substrate. Each step is as described below.

Step for Forming Pattern

In the method for forming a pattern, the pattern may be formed by discharging the diffusing agent composition to adhere on a semiconductor substrate using an ink-jet discharging device. As the ink-jet discharging device, any one of piezo discharging devices in which a piezo element (piezoelectric element) is used that is deformed when a voltage is applied, and thermal discharging devices which utilize bubbles generated by heating can be used. After the pattern is formed in this manner, the diffusing agent composition layer is preferably dried using a conventionally well-known means such as an oven. The thickness of the formed pattern, i.e., the diffusing agent composition layer is preferably 0.1 to 0.6 μm. By forming the pattern having such a thickness, the component (b) can be dispersed into the semiconductor substrate efficiently. In addition, the difference between maximum and minimum thicknesses of the diffusing agent composition layer formed after coating can be minimized to no greater than 0.1 μm by containing the component (c2), as described above.

Step for Diffusing Impurity-Diffusing Component (B) in Pattern into Semiconductor Substrate The step of allowing the impurity-diffusing component (b) in the pattern to be diffused into the semiconductor substrate is not particularly limited, and can be carried out using a conventionally well-known method. For example, baking may be carried out using a diffusion furnace such as an electric furnace. The baking may be carried out either in an inert gas atmosphere, or in an ambient air atmosphere. The baking temperature is preferably 800 to 1000° C. Furthermore, heating may be carried out by irradiating a commonly used laser in place of the diffusion furnace. Accordingly, the component (b) is diffused into the semiconductor substrate, and thus a "p" type or "n" type diffusion region is formed depending on the added element. Thereafter, an electrode can be formed by providing an "n" region or "p" region contact hole according to a common procedure at a site where the component (b) of the semiconductor substrate had been diffused.

Method for Forming Solar Battery

According to the third aspect of the present invention, a method for production of a solar battery is provided including the above method for production of an electrode. Furthermore, according to the fourth aspect of the present invention, a solar battery is provided produced by the method for production. The solar battery may be formed by a method in which a conductor lead is mounted by a conventionally well-known method on the electrode formed as described above, and the like. The method for production of an electrode according to the present invention enables the diffusion region of the impurity to be selectively situated at a desired site by using ink-jet printing. Therefore, production of a solar battery is enabled without need of a complicated step, and without using a large amount of the diffusing agent composition, as compared with conventional methods.

EXAMPLES

The present invention is explained in detail by way of the following Examples. However, the present Examples are provided for the purpose of illustration of the present invention, and the scope of the present invention is not limited thereto.

Example 1

Preparation of Diffusing Agent Composition

A tetraethoxysilane hydrolysis product (molecular weight (Mw): about 2,000) in an amount of 9.0% by mass as a silicon compound in terms of the $SiO_2$ equivalent, 1.0% by mass of diphosphorus pentaoxide ($P_2O_5$), 75% by mass of ethanol (boiling point: 78.3° C.), 5.0% by mass of dipropylene glycol (boiling point: 232° C.) and 10.0% by mass of propylene glycol (boiling point: 187° C.) were mixed homogenously, and the mixture was filtered through a 0.45 μm membrane filter to prepare a diffusing agent composition.

Examples 2 to 9, Comparative Examples 1 to 2

Each component was blended in an amount shown in Table 1 to prepare diffusing agent compositions similarly to Example 1. In Table 1, EtOH indicates ethanol; DPG indicates dipropylene glycol; PG indicates propylene glycol; PPG indicates polypropylene glycol (molecular weight: 700); and COS indicates a colloidal silica (PL-1-IPA: manufactured by Fuso Chemical Co., Ltd., containing 3% by mass isopropyl alcohol relative to the entire diffusing agent composition), respectively. The unit is on % by mass basis except for the surfactant (ppm by mass).

TABLE 1

| Number | $SiO_2$—equivalent concentration | $P_2O_5$ | Solvent composition (% by mass) | | | Surfactant | PPG | COS |
| --- | --- | --- | --- | --- | --- | --- | --- | --- |
| | | | EtOH | DPG | PG | | | |
| Example 1 | 9.0 | 1.0 | 75 | 5 | 10 | — | — | — |
| Example 2 | 9.0 | 1.0 | 75 | 5 | 10 | 1500[1] | — | — |
| Example 3 | 9.0 | 1.0 | 75 | 5 | 10 | 1500[2] | — | — |
| Example 4 | 9.0 | 1.0 | 77.5 | 5 | 7.5 | 1000[2] | — | — |
| Example 5 | 5.4 | 2.0 | 80.1 | 5 | 7.5 | 2000[2] | — | — |
| Example 6 | 3.0 | 2.0 | 75 | 5 | 7.5 | 1000[2] | — | — |
| Example 7 | 3.0 | 2.5 | 75 | 5 | 5 | 700[2] | — | — |
| Example 8 | 3.0 | 2.0 | 90 | 3 | 2 | 1000[2] | 0.5 | — |
| Example 9 | 3.0 | 2.0 | 90 | 3 | 2 | 1000[2] | — | 0.06 |
| Comparative Example 1 | 9.0 | 1.0 | 85 | 5 | — | — | — | — |
| Comparative Example 2 | 9.0 | 1.0 | 85 | 5 | — | 2000[1] | — | — |

Note)
[1]SH28PA (silicone based surfactant, manufactured by Dow Corning Toray Co., Ltd.),
[2]SF8421EG (silicone based surfactant, manufactured by Dow Corning Toray Co., Ltd.) Uniformity of Coated Diffusing Agent Composition Layer, and Measurement of Resistance Value of Formed Electrode Using the diffusing agent compositions of Examples 1 to 3 and Comparative Examples 1 and 2, determination of the uniformity of the diffusing agent composition layer coated as in the following, and the resistance value of the formed electrode was carried out.

Formation of Pattern

The diffusing agent composition prepared as described above was discharged to coat on a 6-inch "p" type silicon substrate using an ink-jet discharging device (manufactured by Roland DG Corporation, flat bed ink-jet discharging device), whereby a desired pattern was obtained. After coating, the composition was dried at 100° C. for 10 min with a dryer. After drying, the difference between maximum and minimum thicknesses of the coated diffusing agent composition layer was measured using a Surface Profiler (product name: manufactured by DEKTAK). The values of the difference between maximum and minimum thicknesses measured are shown in Table 2.

TABLE 2

| Number | Difference between maximum and minimum thicknesses (μm) |
|---|---|
| Example 1 | 0.1 |
| Example 2 | <0.1 |
| Example 3 | <0.1 |
| Comparative Example 1 | 1.2 |
| Comparative Example 2 | 0.2 |

Evaluation

It was revealed that addition of the solvent (c2) having a boiling point of 180 to 230° C. enables a coated diffusing agent composition layer having less difference between maximum and minimum film thicknesses, i.e., a uniform layer to be formed (comparison of Example 1 with Comparative Example 1). It was also revealed that a further uniform layer can be formed by adding a surfactant (comparison of Example 1 with Example 2).

Observation of Bleeding of Pattern

Figure 2:
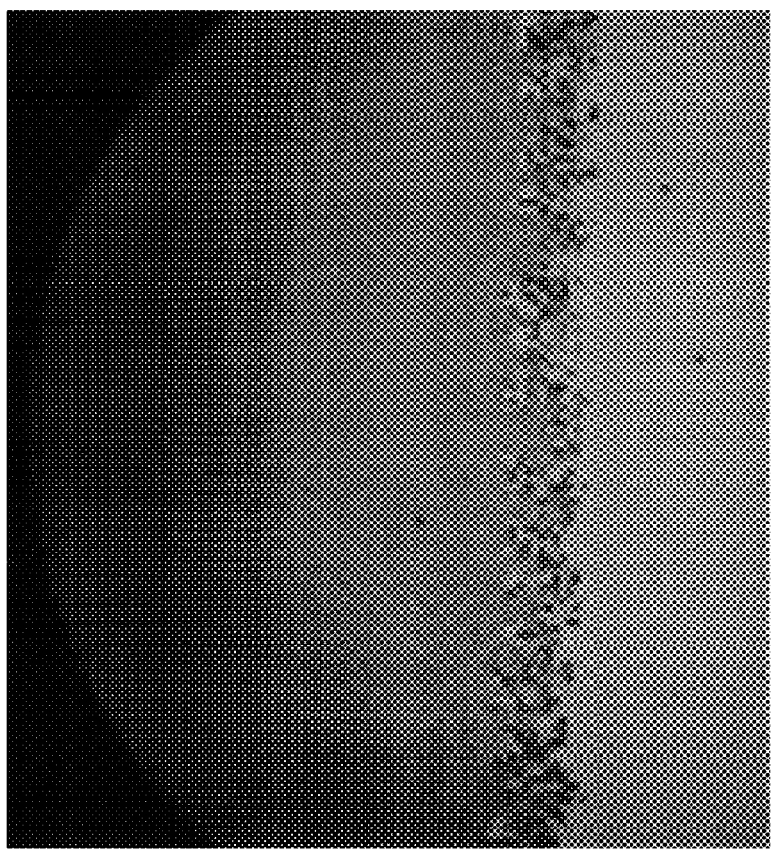
FIG. 2 shows a view illustrating a part of a layer formed using a diffusing agent composition of Example 3.
Figure 3:
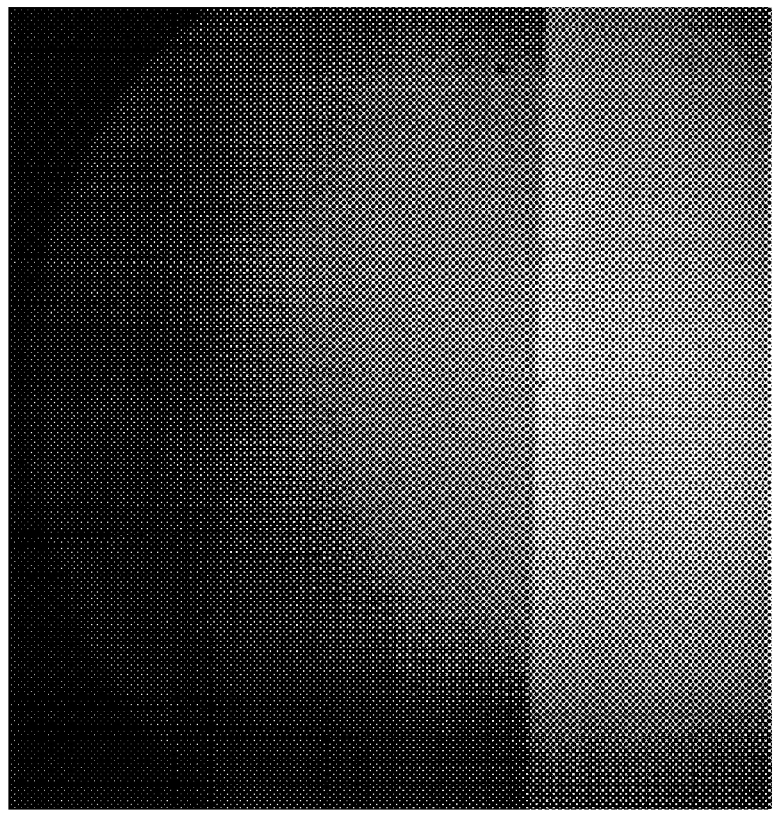
FIG. 3 shows a view illustrating a part of a layer formed using a diffusing agent composition of Example 4.

The shape of the pattern obtained by coating with the diffusing agent compositions of Examples 2 to 4 on the 6-inch "p" type silicon substrate as described above followed by drying was observed using an optical microscope (manufactured by Olympus Corporation). The results are shown in FIGS. 1 to 3. In the drawings, the results are shown: of Example 2 in FIG. 1; of Example 3 in FIG. 2; and of Example 4 in FIG. 3.

Evaluation

By observing bleeding of the pattern, it was revealed that in the range of the amount (1 to 20% by mass) of the added solvent (c2) having a boiling point of 180 to 230° C., the bleeding was prevented to a greater extent as the amount added was lowered (comparison of Example 4 with Examples 2 and 3).

Diffusion Efficiency Test

Using the diffusing agent compositions of Examples 5 to 7, an "n" type diffusion layer was formed as described above, and the sheet resistance was measured. The measurement of the sheet resistance was carried out as in the following.

Measuring Method of Sheet Resistance

The silicon substrate on which the diffusing agent composition was coated as described above was baked in a nitrogen atmosphere in an electric furnace at 950° C. for 30 min to form an "n" type diffusion layer. The sheet resistance value of thus formed "n" type diffusion layer was measured using a sheet resistance meter "VR-70" (product name, manufactured by Kokusai Electric Co., Ltd.) in accordance with a four probe method. Thus measured resistance values are shown in Table 3.

TABLE 3

| Number | Resistance value (Ω) |
|---|---|
| Example 5 | 122 |
| Example 6 | 35 |
| Example 7 | 59 |

Evaluation

It was revealed that the resistance value decreased by controlling to optimize the amounts of the silicon compound (a) and the impurity-diffusing component (b) blended, suggesting that diffusion of the impurity was executed with favorable efficiency (Examples 6 and 7).

Figure 4A:
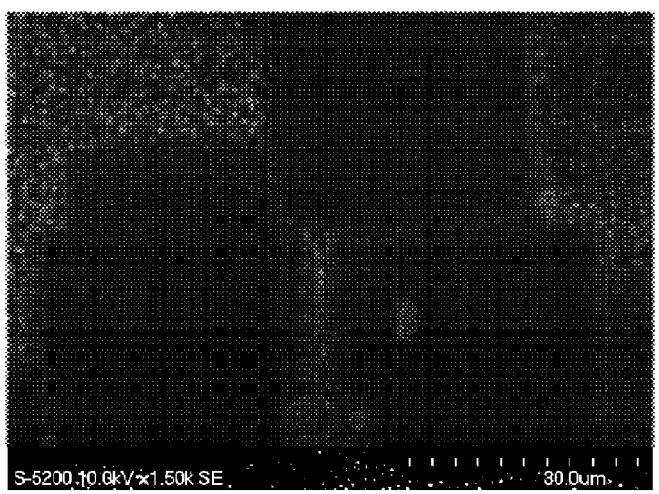
FIGS. 4A to 4C show a view illustrating a part of a layer formed using a diffusing agent composition of Example 8.
Figure 4B:
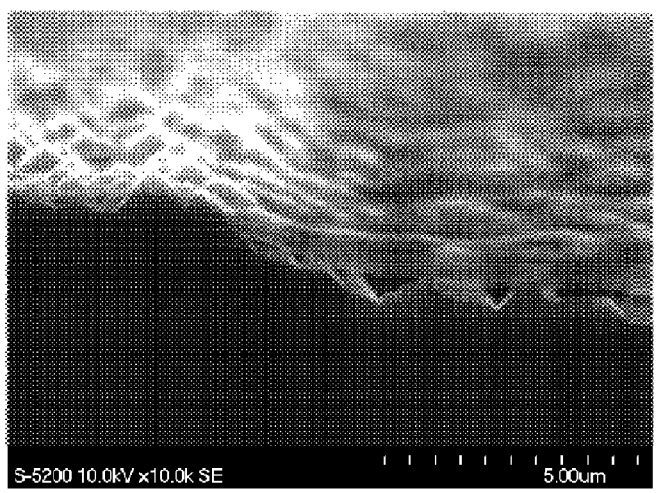
Figure 4C:
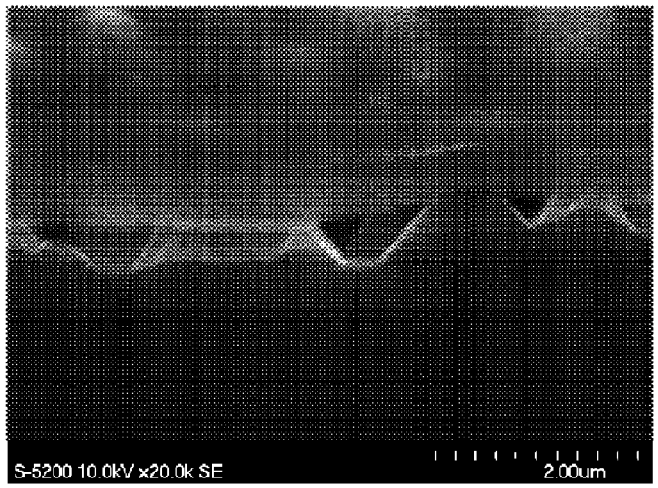
Figure 5A:
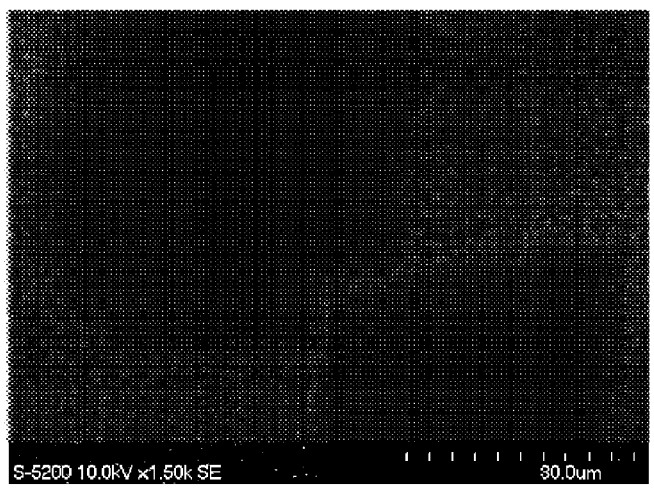
FIGS. 5A to 5C show a view illustrating a part of a layer formed using a diffusing agent composition of Example 9.
Figure 5B:
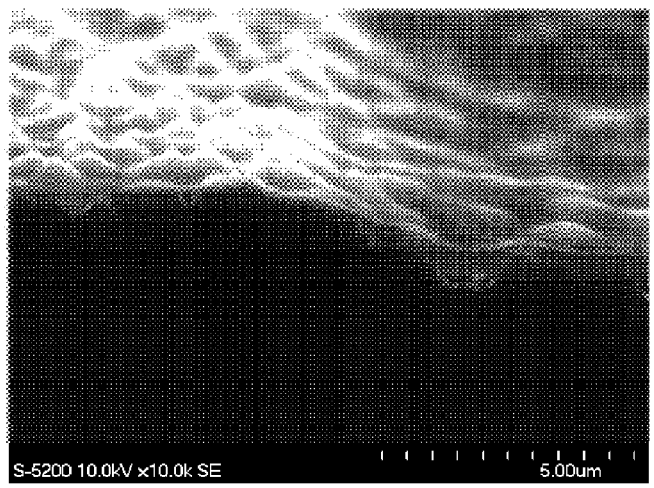
Figure 5C:
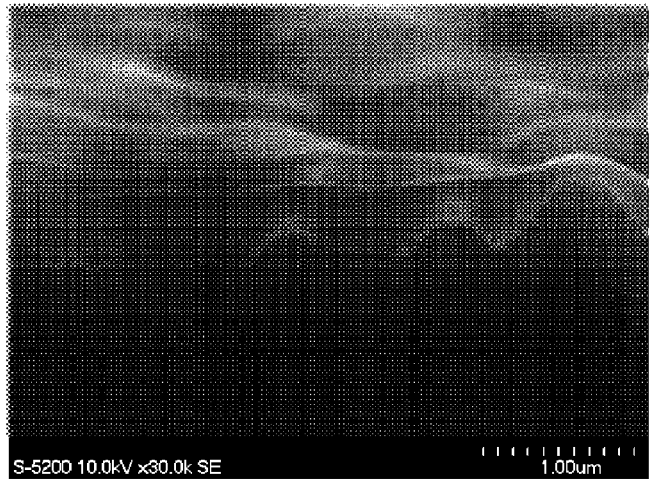

Test of Prevention of Generation of Crack, and Prevention of Rising of Film After Coating Patterns were formed using the diffusing agent compositions of Examples 8 and 9, and subsequently the silicon substrate on which the diffusing agent composition had been coated was baked at 950° C. for 30 min. Thereafter, the appearance of the surface was observed using a scanning electron microscope "S-5200" (trade name, manufactured by Hitachi High-Technologies Corporation). The results are shown in FIGS. 4A to 4C and FIGS. 5A to 5C. FIGS. 4A to 4C show the results of Example 8, and FIGS. 5A to 5C show the results of Example 9. A composition (Comparative sample) was prepared similarly to Example 8 except that PPG was not blended in Example 8, and thus resulting composition was subjected to observation as described above. The results are shown in FIGS. 6A to 6C.

Evaluation

Figure 6A:
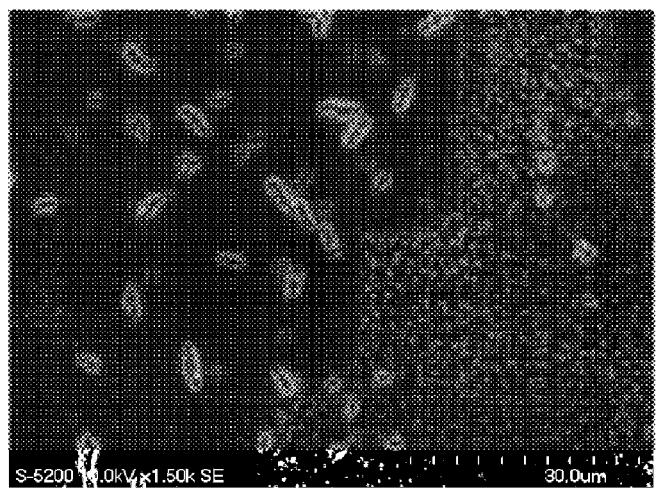
FIGS. 6A to 6C show a view illustrating a part of a layer formed using a diffusing agent composition of Comparative sample.
Figure 6B:
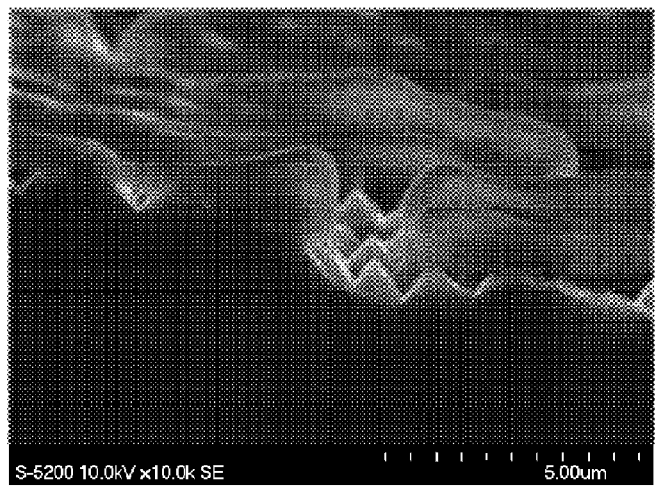
Figure 6C:
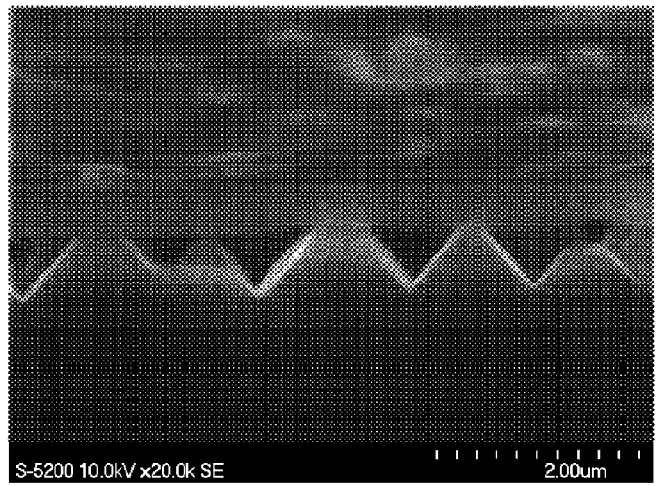

In FIG. 4A, FIG. 5A and FIG. 6A, the elliptical portion suggests generation of a crack. It is found that remarkably many elliptical portions are seen in FIG. 6A as compared with other two Figures. FIG. 4B, FIG. 5B and FIG. 6B show a cross sectional view of a part of the film formed using the diffusing agent composition. It is revealed from FIG. 6B that the formed film was ruptured. Additionally, FIG. 4C, FIG. 5C and FIG. 6C show a cross sectional view of another part of the film formed using the diffusing agent composition. In FIG. 6C, it can be seen that the rise of the formed film is more pronounced as compared with other two Figures.

From the foregoing, it was proven that generation of crack and rising of the formed film can be prevented by the porogen or colloidal silica contained in the diffusing agent composition according to the present invention.

The invention claimed is:

1. A method for production of an electrode comprising:
   forming a pattern by discharging a composition including (a) a silicon compound, (b) an impurity-diffusing component, and (c) a solvent on a semiconductor substrate by an ink-jet system; and
   allowing the impurity-diffusing component (b) in the pattern diffuse into the semiconductor substrate,
   wherein the solvent (c) contains (c1) a solvent having a boiling point of no higher than 100° C. and (c2) a solvent having a boiling point of greater than 180 to less than or equal to 230° C.; and wherein the solvent (c1) is present at a ratio of 70 to 90% by mass and the solvent (c2) is present at a ratio of 1 to 20% by mass both relative to the total mass of the composition.

2. The method according to claim 1, wherein the silicon compound (a) is a hydrolysis product of alkoxysilane.

3. The method according to claim 1, wherein the concentration of the silicon compound (a) in terms of the $SiO_2$ equivalent is 2 to 10% by mass relative to the total mass of the composition.

4. The method according to claim 1, wherein the impurity-diffusing component (b) comprises at least one of a compound of a group III element and a compound of a group V element.

5. The method according to claim 1 further comprising a surfactant (d).

6. The method according to claim 1, wherein the composition further comprises a porogen or a colloidal silica.

7. The method according to claim 6, wherein the content of the porogen or the colloidal silica is no greater than 10% by mass of the total solid content.

8. The method according to claim 1, wherein the pattern has a difference between maximum and minimum film thicknesses of no greater than 0.1 μm.

* * * * *